(12) United States Patent
Huang et al.

(10) Patent No.: US 7,557,363 B2
(45) Date of Patent: Jul. 7, 2009

(54) CLOSED LOOP DOSE CONTROL FOR ION IMPLANTATION

(75) Inventors: Yongzhang Huang, Hamilton, MA (US); Brian S. Freer, Medford, MA (US); John Ye, Brighton, MA (US); Christopher Godfrey, Rowley, MA (US); Michael A. Graf, Belmont, MA (US); Patrick Splinter, Middleton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 363 days.

(21) Appl. No.: 11/543,346

(22) Filed: Oct. 4, 2006

(65) Prior Publication Data
US 2007/0278427 A1      Dec. 6, 2007

Related U.S. Application Data (60) Provisional application No. 60/810,430, filed on Jun. 2, 2006.

(51) Int. Cl.
*H01J 37/317* (2006.01)
(52) U.S. Cl. .................................... 250/492.21
(58) Field of Classification Search .............. 250/492.21
See application file for complete search history.

(56) References Cited

U.S. PATENT DOCUMENTS

| | | | |
|---|---|---|---|
| 4,539,217 A | 9/1985 | Farley | |
| 4,587,433 A | 5/1986 | Farley | |
| 4,922,106 A | 5/1990 | Berrian et al. | |
| 5,998,798 A | 12/1999 | Halling et al. | |
| 6,608,316 B1 * | 8/2003 | Harrison | 250/492.21 |
| 6,657,209 B2 | 12/2003 | Halling | |
| 6,822,247 B2 * | 11/2004 | Sasaki | 250/492.21 |
| 6,908,836 B2 * | 6/2005 | Murrell et al. | 438/535 |
| 6,984,833 B2 | 1/2006 | Sano et al. | |
| 7,365,346 B2 * | 4/2008 | Sasaki et al. | 250/492.21 |
| 2005/0189500 A1 | 9/2005 | Graf et al. | |
| 2005/0269526 A1 | 12/2005 | Rathmell | |

FOREIGN PATENT DOCUMENTS

JP      61116743      6/1986

* cited by examiner

Primary Examiner—Jack I Berman
(74) Attorney, Agent, or Firm—Eschweiler & Associates, LLC (57) ABSTRACT

A method derives a terminal return current or upstream current to adjust and/or compensate for variations in beam current during ion implantation. One or more individual upstream current measurements are obtained from a region of an ion implantation system. A terminal return current, or composite upstream current, is derived from the one or more current measurements. The terminal return current is then employed to adjust scanning or dose of an ion beam in order to facilitate beam current uniformity at a target wafer.

27 Claims, 7 Drawing Sheets

CLOSED LOOP DOSE CONTROL FOR ION IMPLANTATION

REFERENCE TO RELATED APPLICATION

This application claims priority to and the benefit of U.S. Provisional Application Ser. Nos. 60/810,430 which was filed Jun. 2, 2006, entitled DOSE CLOSE LOOP CONTROL FOR ION IMPLANTATION the entirety of which is hereby incorporated by reference as if fully set forth herein.

FIELD OF THE INVENTION

The present invention relates generally to ion implantation systems, and more specifically to systems and methods for controlling and adjusting dose.

BACKGROUND OF THE INVENTION

In the manufacture of semiconductor devices, ion implantation is used to dope semiconductors with impurities or dopants. Ion beam implanters are used to treat silicon wafers with an ion beam, in order to produce n or p type extrinsic material doping or to form passivation layers during fabrication of an integrated circuit. When used for doping semiconductors, the ion beam implanter injects a selected ion species to produce the desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway can be evacuated to reduce the probability of ions being deflected from the predetermined beam path as a result of collisions with gas molecules.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made very pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway which will effectively separate ions of different charge-to-mass ratios.

Dosimetry is the measurement of the number of ions per unit area implanted in a wafer or other workpiece. In controlling the dosage of implanted ions, closed loop feedback control systems typically are utilized in order to dynamically adjust the implantation to achieve uniformity in the implanted workpiece. In one example, a control system utilizes real-time current monitoring to control the slow scan velocity. A Faraday disk or Faraday cup periodically measures the beam current and adjusts the slow scan speed to ensure constant dosing. Frequent measurement allows the dose control system to respond quickly to changes in beam current. The Faraday cup may be stationary, well shielded, and located close to the wafers, making it sensitive to the beam current actually dosing the wafers.

Faraday cups measure only the electric current. Interactions between the ion beam and gases evolved, such as from photo resist, during implant can result in a change in charge state of some of the beam ions, most commonly from a singly-charged positive ion to a neutral atom. As a result, the measured flux or beam current can misrepresent the actual beam current or flux. Implanted neutrals contribute to the dose received by a wafer, but are not measurable by a faraday cup. As a result, the wafer can be overdosed and/or have substantial dose non-uniformities.

A conventional mechanism to account for such variations employs obtaining pressure readings in addition to the faraday cup readings. Both the pressure readings and the faraday cup measurements are then employed to adjust beam current. However, the amount of correction applied to the faraday current reading depends, for example, on the beam energy and ion species. In addition the magnitude of the correction can be large, which necessitates accurate determination of compensation factors and precise pressure measurements. In practice it can be difficult to use such methods to obtain the desired dose uniformity and repeatability.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

Aspects of the present invention compensate for variations in beam current resulting from out gassing during ion implantation. A terminal return current is obtained or derived that indicates or represents a full beam current prior to neutralization is employed to detect or identify variations in beam current. A faraday cup does not account for neutralized ions or dopants and, therefore, can fail to detect and/or indicate beam current variations and/or can detect or indicate variations when none are present.

The measurement of terminal return current, or the individual currents used to calculate it, is taken upstream of the wafer in a region less affected by pressure from photoresist outgassing and the resulting neutralization. The terminal return current can be obtained or derived by electrically isolating the source and beamline components upstream of the terminal aperture, which may be at, near, or somewhat downstream of the resolving aperture, and measuring the current needed to maintain the terminal at the desired potential. This terminal return current is approximately equal to the ion current leaving the terminal. Alternatively, the terminal return current can be synthesized by measuring one or more currents of enclosures, housings, electrodes, and the like generated by a passing ion beam. The individual currents can be processed into the terminal return current. Once obtained, the terminal return current can be employed to adjust dose or scanning of an ion beam in order to facilitate beam current and implant uniformity across wafers.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with reference to the drawings wherein like reference numerals are used to refer to like elements throughout, and wherein the illustrated structures are not necessarily drawn to scale.

Out gassing, such as photo-resist out gassing, is an issue for ion implantation systems. The out gassing increases the vacuum pressure in the system and causes some of the ions of an ion beam to change to neutrals. The neutrals are not conventionally detected, and thus cause problems with dosimetry. This can be especially problematic in high current ion implantation systems, for example with beam current values greater than about 1 mA, where beam powers are high. As a result, dose control for conventional systems is problematic. A conventional technique known as pressure compensation is not, at least in some instances, sufficient to deal with the above neutralization problems.

Aspects of the present invention employ a terminal return current, also referred to as an upstream current measurement to adjust scanning speed of the wafers. The terminal return current can include, for example, beam guide current, power supply current, and other individual upstream current measurements. The terminal return current can indicate, for example, the amount of percentage loss of the ion beam inside the magnet and employed to adjust a wafer scan speed in one or more directions, such as horizontal, vertical, slow, fast, and the like, and thereby improve dosimetry. The terminal return current and scanning control are employed in a closed loop system.

The terminal return current is obtained or derived and indicates or represents a full beam current prior to neutralization is employed to detect or identify variations in beam current. A faraday cup measures current during only a portion of implantation and is positioned downstream of a target wafer. A faraday cup does not account for neutralized ions or dopants and, therefore, can fail to detect and/or indicate beam current variations and/or can detect or indicate variations when none are present. The term terminal return current does not necessarily imply connection a terminal or measured current to/from a terminal. The terminal return current can be derived otherwise and in some ways simulate or approximate an actual terminal current.

The measurement of terminal return current, or the individual currents used to calculate it, is taken upstream of the wafer in a region less affected by pressure from photoresist outgassing and the resulting neutralization. For example, the terminal return current can be obtained or derived by electrically isolating the source and beamline components upstream of a terminal aperture, which may be at, near, or somewhat downstream of the resolving aperture, and measuring the current needed to maintain the terminal at the desired potential. This terminal return current is approximately equal to the ion current leaving the terminal. Alternatively, the terminal return current can be synthesized by measuring one or more currents of enclosures, housings, electrodes, and the like generated by a passing ion beam. These individual currents can be processed into the terminal return current. Once obtained, the terminal return current can be employed to adjust dose or scanning of an ion beam in order to facilitate beam current and implant uniformity across wafers.

Figure 1:
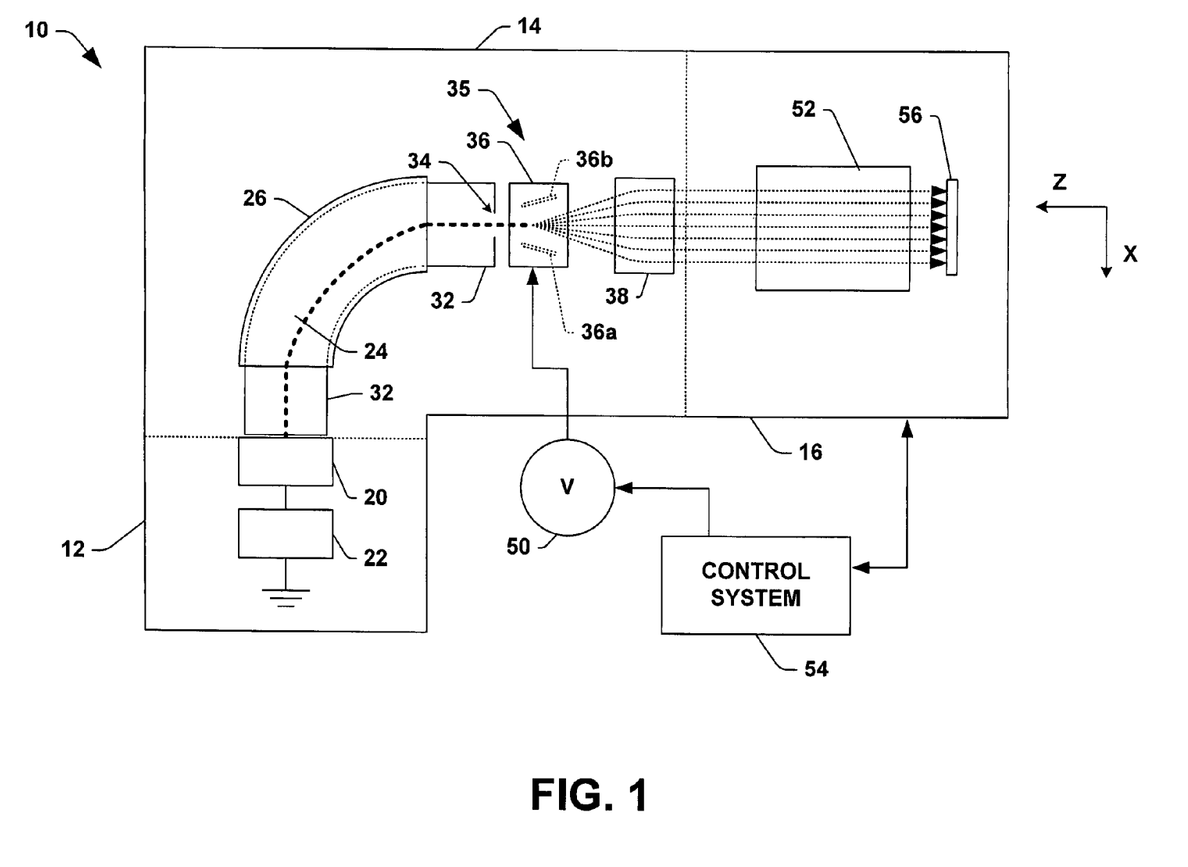
FIG. 1 is a plan view drawing that illustrates an exemplary ion implantation suitable for implementing one or more aspects of the present invention.

FIG. 1 is a plan view drawing that illustrates an example ion implantation system 10 having a terminal 12, a beamline assembly 14, and an end station 16. The example system 10 is suitable for implementing one or more aspects of the present invention. It is appreciated that aspects of the present invention can be implemented with other ion implantation systems.

It is appreciated that the system 10 shown and described is a medium current system and is provided for illustrative purposes. It is appreciated that aspects of the present invention are not limited to the system 10 and that other ion systems, such as high current ion implantation systems, can also be employed in accordance with the present invention.

The terminal 12 includes an ion source 20 powered by a high voltage power supply 22 that produces and directs an ion beam 24 to the beamline assembly 14. The ion source 20 generates charged ions that are extracted from the source 20 and formed into the ion beam 24, which is directed along a beam path in the beamline assembly 14 to the end station 16.

The beamline assembly 14 has a beamguide 32, a mass analyzer 26 in which a dipole magnetic field is established to pass only ions of appropriate charge-to-mass ratio through a resolving aperture 34, a scanning system 35, and a parallelizer 38. The ion implantation system 10 may also include various beam forming and shaping structures extending between the ion source 20 and the end station 16, which maintain the ion beam 24 and bound an elongated interior cavity or passageway through which the beam 24 is transported to the workpiece 30 supported in the end station 16. This ion beam transport passageway is typically evacuated to reduce the probability of ions being neutralized or deflected from the beam path through collisions with air molecules.

The implanter may optionally employ different types of beam scanning systems. For example, electrostatic systems, shown, couple a high-voltage power supply to scan plates. The voltage on the plates is adjusted to scan the beam. In magnetic systems, a high current supply is connected to the coils of an electromagnet. The magnetic field is adjusted to scan the beam. For purposes of this invention, all different types of scanning systems are equivalent and the electrostatic system is used for illustration.

The scanning system 35 includes a scanner 36 and a power supply 50 coupled to scanner plates or electrodes 36*a* and 36*b*, where the scanner 36 receives a mass analyzed ion beam 24 along the beam path from the mass analyzer 26 and provides a scanned beam 24 along the beam path to a parallelizer 38. It is noted that alternate aspects of the invention can, for example, also include ion implantation systems that omit such a scanning system and batch scanning systems. The parallelizer 38 then directs the scanned beam 24 to the end station 16 such that the beam 24 strikes measurement sensor (s) of the dosimetry system 52 at a generally constant angle of incidence.

The scanner 36 receives a mass analyzed ion beam 24 having a relatively narrow profile (e.g., a "pencil" beam in the illustrated system 10), and a voltage waveform applied by the power supply 50 to the scanner plates 36a and 36b operates to scan the beam 24 back and forth in the X direction (the scan direction) to spread the beam 24 out into an elongated "ribbon" beam (e.g., a scanned beam 24), having an effective X direction width that may be at least as wide as or wider than the workpieces of interest. The scanned beam 24 is then passed through the parallelizer 38 that directs the beam toward the end station 16 generally parallel to the Z direction (e.g., generally perpendicular to the workpiece surface).

The implanter 10 may employ different types of end stations 16. For example, "batch" type end stations can simultaneously support multiple workpieces 30 on a rotating support structure, wherein the workpieces 30 are rotated through the path of the ion beam until all the workpieces 30 are completely implanted. A "serial" type end station, on the other hand, supports a single workpiece 30 along the beam path for implantation, wherein multiple workpieces 30 are implanted one at a time in serial fashion, with each workpiece 30 being completely implanted before implantation of the next workpiece 30 begins.

The illustrated end station 16 is a "serial" type end station that supports a single workpiece 56 along the beam path for implantation (e.g., a semiconductor wafer, display panel, or other workpiece to be implanted with ions from the beam 24), wherein a dosimetry system 52 is situated near the workpiece location The dosimetry system consists of one or more current measurement systems, which can be used to determine ion current and/or ion current density in one or more dimensions. The dosimetry system 52 is operably coupled to a control system 54 to receive command signals therefrom and to provide measurement values thereto.

The control system 54 also obtains a terminal return current, also referred to as an upstream current or composite upstream current, from a region ending about or downstream of the mass analyzer 26. The terminal return current, in one example, is proportional to beam current exiting the mass analyzer 26 before substantial neutrals are present in the ion beam 24 due to mass analysis. It is appreciated that neutralization of the beam 24 can occur during operation, particular with regard to pressure-altering out gassing, such as occurs with photo resist. As a result, the terminal return current can facilitate identification of beam current because it is not susceptible to such pressure based alterations or presence of neutrals in the region downstream of the terminal return current measurement. The region upstream of the terminal current measurement is generally at a much lower pressure than downstream. The errors due to neutralization after the analyzer but before the measurement of the terminal return current are therefore much lower than those in the region between the resolving aperture and the faraday. The terminal return current can be employed to adjust scanning and/or generation of the ion beam 24 in order to obtain a desired or selected uniformity and avoid variations. Alternatively, the terminal return current can be used to alter the path or velocity of the wafer in front of the beam in one or more axes of motion.

The terminal return current, in one example, can comprise one or more individual upstream current measurements, such as electrode currents, housing currents, power supply currents, and the like. In one example, current measurements are obtained by measuring charge on, for example, a beam guide enclosure or other component that builds up from positive ions passing there through. The terminal return current can be processed with scaling factors, filters, impedance matching, addition of multiple currents, and the like. The scaling factors and like can be determined during calibration.

Figure 2:
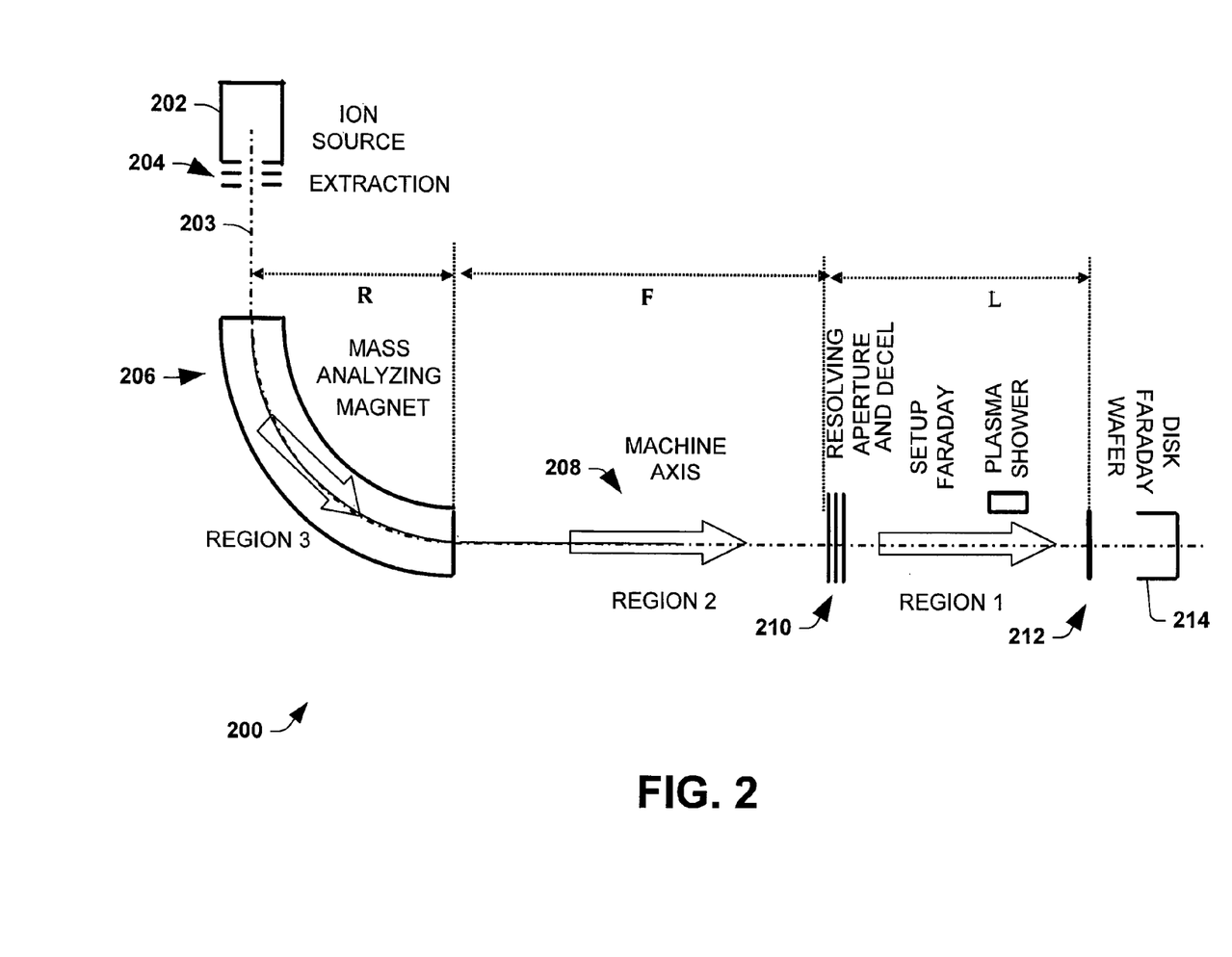
FIG. 2 is a diagram illustrating an ion implantation system 200 various regions within the system in accordance with an aspect of the present invention.

FIG. 2 is a diagram illustrating an ion implantation system 200 and various regions within the system 200 in accordance with an aspect of the present invention. The system 200 is provided as an example in order to illustrate where neutralization occurs and its impact upon an ion beam.

The system 200 includes an ion source 202 that generates an ion beam 203 in conjunction with extraction electrodes 204. The ion beam source 202 includes, for example, a plasma source with an associated power source. The plasma source may, for example, comprise an ionization chamber and extraction optics from which a focused and shaped ion beam is extracted. The ion source 202 generates the ion beam 203 having selected dopant(s) or species. Some examples of selectable dopants include, for example, boron, which is p-type and phosphor, which is n-type. The extraction electrodes 204 serve to extract the ion beam 203 from the ion source with an initial energy.

The ion beam 203 travels downstream through a mass analyzing magnet 206. The mass analyzing magnet 206 selectively passes ions having an appropriate charge-to-mass ratio. Other ions or particles pass through the magnet 206 along a different path or trajectory and exit the beam 203. Downstream of the mass analyzing magnet 206 is an assembly or portion 208, which can include, for example, a scanner, accel/decel electrodes, and the like.

A resolving aperture and decel 210 is shown downstream of the assembly 208 and serves to remove unselected ions and particles from the beam 203. The beam 203 is directed toward a target wafer 212. A faraday 214 is positioned downstream of the wafer 212 in order to measure beam current or flux.

It is noted that out gassing can occur during ion implantation, in particular from photo resist. Pressure variations result there from and increased neutralization can occur and/or beam current can be altered. The faraday 214 can fail to properly measure the total dopant flux, the sum of ions and neutrals, due to the neutrals within the beam 203.

FIG. 2 also shows three regions of the system 200. Region 3 encompasses the path of the ion beam 203 from the ion source 202 and exiting the resolving magnet 206. In region 3, neutralized dopants or ions do not have the selected charge-to-mass ratio and typically fail to pass through the magnet 206 and still be present within the beam 203. Region 2 encompasses the path of the ion beam 203 from the mass analyzing magnet 206 to the resolving aperture 210. In region 2, neutralized dopants or ions largely remain in the ion beam 203 because the beam 203 is traveling in a straight line or line of sight toward the target wafer 212. Region 1 encompasses the path of the ion beam 203 from and including the resolving aperture 210 to the target wafer 212. As with region 2, region 1 has the characteristic that neutralized dopants or ions tend to remain within the ion beam because the beam 203 is traveling in a straight line or line of sight to the target wafer 212. Additionally, significant neutralization of ions within the beam 203 can occur within region 1 due to its proximity to the target wafer 212 and the occurrence of out-gassing.

Aspects of the present invention identify, measure, and/or derive a terminal return current, also referred to as an upstream current, that is closely related to beam current of the ion beam 203 as it exits the magnet 206 and region 3, also referred to as full current. At that point, substantial quantities of neutralized dopants or ions are not present in the beam due to the mass analyzing magnet 206. The terminal return current can then be employed to adjust for beam current variations in order to improve dose uniformity.

The terminal return current can be obtained in FIG. 2 by measuring one or more currents about the mass analyzing magnet in Region 1 and/or in Region 2. For example, a current measurement can be taken from a terminal of a structure/enclosure surrounding the beam downstream of the mass analyzing magnet 206. The current measurement can be from the terminal to ground. Similarly, current measurements can also be taken from the extraction electrodes 204, the magnet 206 itself or housing containing it, and the like. The measured currents can be processed and conditioned to yield the terminal return current that approximates and/or indicates the full beam current of the ion beam 203.

Figure 3:
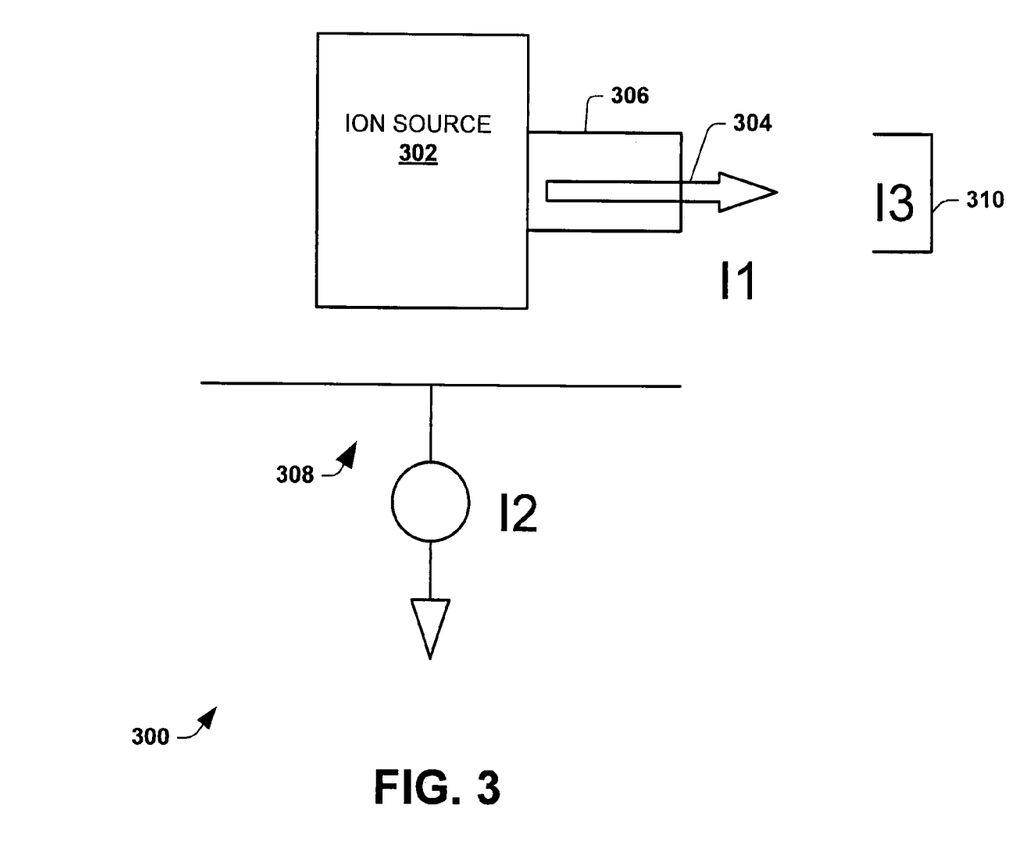
FIG. 3 is a block diagram illustrating a terminal return current system for ion implantation systems in accordance with an aspect of the present invention.

FIG. 3 is a block diagram illustrating a terminal return current system 300 for ion implantation systems in accordance with an aspect of the present invention. Various details and components of ion implantation systems are omitted in order to more fully illustrate the present invention.

An ion source 302 produces an ion beam 304 that travels along a path. A mass analyzer 306 performs mass analysis on the beam 304 and passes only those particles having a selected charge-to-mass ratio, which includes selected dopant(s). As a result, a full beam current, represented as I1 in FIG. 3 exits from the mass analyzer 306.

A faraday cup 310 is located downstream and proximate to a target wafer or end station (not shown). The faraday cup 310 measures beam current, but as previously shown, does not account for neutralized ions within the beam 304 and, as a result, does not necessarily provide an accurate measurement of dopant flux. The faraday measured current from the faraday cup, referred to as I3 in FIG. 3, does not account for neutrals within the ion beam 304.

A measuring device 308 measures and/or obtains a terminal return current, shown in FIG. 3 as I2. The measuring device 308 measures one or more individual upstream currents from a separate structure and/or other portions about the mass analyzer 306 to obtain the terminal return current. As an example, the measured upstream currents can be obtained from the ion current injected into the beamguide minus the current that needs to be supplied to the beamguide to balance the positive charge caused by ions hitting the beamguide to prevent the beamguide from accumulating charge. In another example, a separate, conductive terminal structure or enclosure is positioned from the source to downstream of a mass analyzer. Current on the terminal structure as a result of positive ions of the beam 304 passing there through and is measured to obtain the terminal return current.

The terminal current (I2) is related to the full current (I1) ideally as I1=−I2. The faraday measured current (I3) is a function of the full current (1), but is usually somewhat less due to beam transportation of the ion beam 304 from the ion source 302 to the faraday cup 310. Additionally, as stated above, the faraday measured current (I3) does not include or represent neutrals within the ion beam 304 and may provide an inaccurate measurement of dopant flux. Furthermore, the faraday measured current (I3) is blocked by a wafer for substantial portions of the ion implantation process.

It can be problematic to directly measure the full beam current (I1) without altering or disrupting an ongoing ion implantation process. Thus, the inventors of the present invention obtain the terminal return current (I2), which can be obtained without disruption. Additionally, the terminal return current (I2) is not blocked by the wafer. Therefore, the terminal return current (I2) can be employed for dose control at all times during implantation, not only when the beam is not blocked by the wafer.

Figure 4:
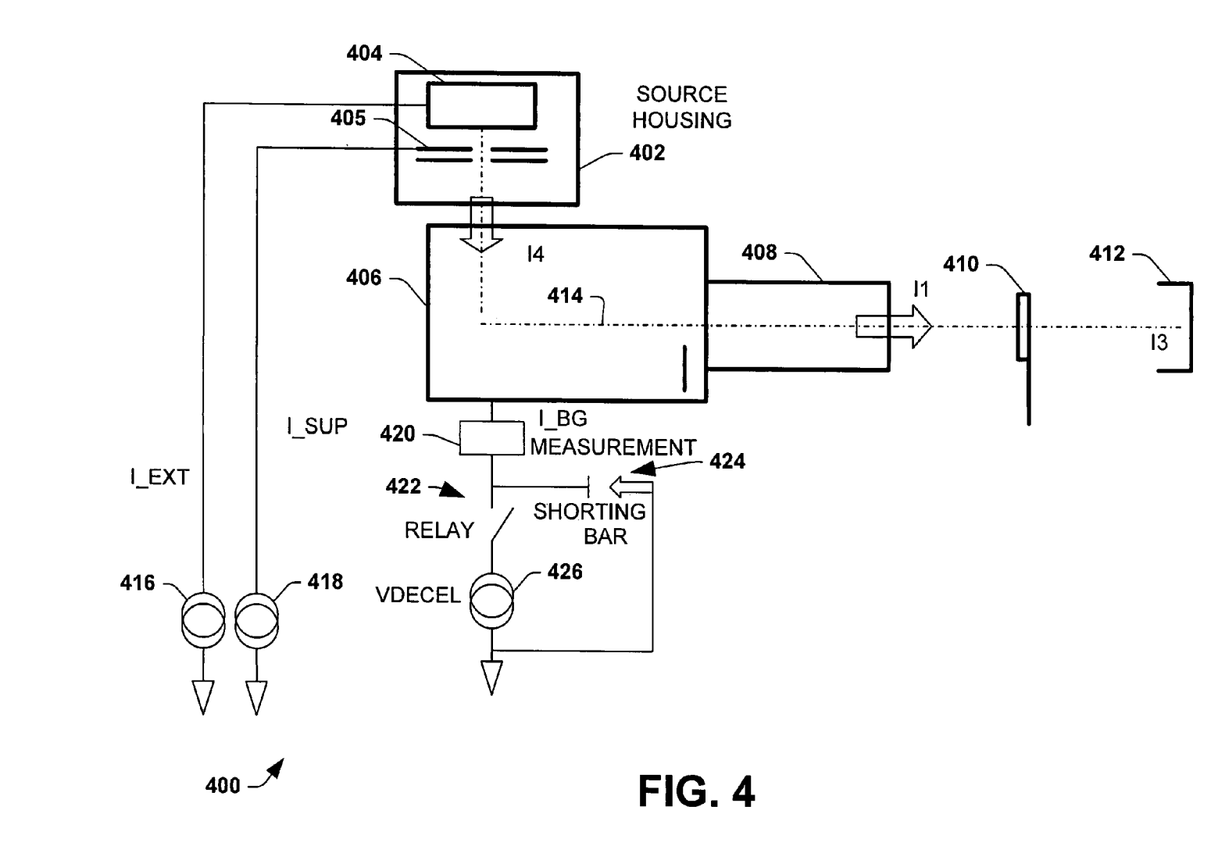
FIG. 4 is a block diagram illustrating a terminal return current system in accordance with an aspect of the present invention.

FIG. 4 is a block diagram illustrating a terminal return current system 400 in accordance with an aspect of the present invention. The system 400 shows one example of a configuration that obtains measured current values from portions of an ion implantation system in order to derive a terminal return current.

The system 400 includes an ion source housing containing an ion source 404 and extraction/suppression electrodes 405. The ion source 404 provides an ion beam 414 containing selected ions or dopant(s). A beam guide enclosure 406 contains components, such as a mass analyzing magnet (not shown) through which the ion beam 414 passes and performs mass analysis on. A separate housing 408 is located downstream of the beam guide enclosure 406 and can comprise, for example, resolving apertures, accel/decel electrodes, scanning systems, and the like.

A target wafer 410 is positioned further downstream from the housing 408 and a faraday cup 412 is positioned behind the wafer 410. A full current, shown as I1 in FIG. 4, exits the housing 408 without substantial amounts of neutrals. The faraday cup 412 obtains a faraday measured current, shown as I3 in FIG. 4, which is less than the full current I1 due to beam transport and neutralization.

A source measurement component 416 is coupled to the ion source 404 and measured an extraction current, I_EXT. An electrode measurement component 418 is coupled to one or more of the suppression electrodes 405 and measures an electrode current, I_SUP. A beam guide measurement component 420 measures a beam guide current, I_BG. The beam guide measurement component 420 can operate in both drift and decel modes, in this example. For drift mode, the beam guide 406 is grounded by a shorting bar 424. For decel mode, the beam guide 406 is connected to the decel PS by the relay 422

The currents I_EXT, I_SUP, and I_BG can then be employed to derive a terminal return current I2 in real time during ion implantation. The current I2 is representative of the full current I1 and can be employed for adjustment of dose during implantation.

Figure 5:
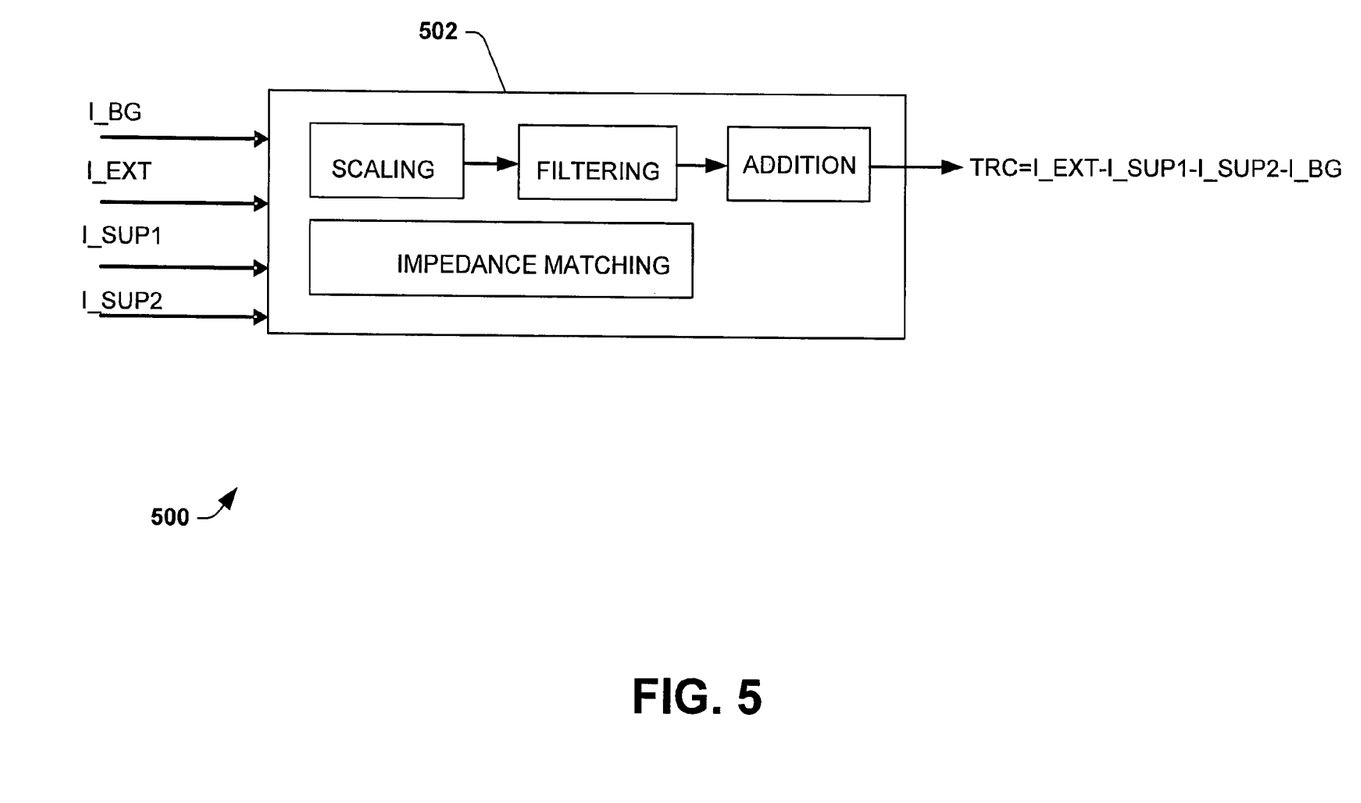
FIG. 5 is a block diagram illustrating a portion of a terminal return current dose control system in accordance with an aspect of the present invention.

FIG. 5 is a block diagram illustrating a portion of a terminal return current dose control system 500 in accordance with an aspect of the present invention. The system 500 includes a signal conditioning component 502 that receives one or more upstream current measurements and derives a terminal return current (TRC). In this aspect, the upstream current measurements include a beam guide enclosure measurement (I_BG), a source extraction measurement (I_EXT), a first suppression electrode measurement (I_SUP1), and a second suppression electrode measurement (I_SUP2). However, it is appreciated that alternate aspects of the invention can include other current/charge measurements.

The signal conditioning component 502 includes a scaling component, a filtering component, and addition component, and an impedance matching component. The impedance matching component compensates for impedance variations for the current measurements. The scaling component applies a scaling value to each of the current measurements. The scaling values can be determined during a calibration or setup process, which employs faraday measured current, for example without a wafer. The filtering component filters noise and/or other unwanted signals from the current measurements. The addition component combines the scaled and filtered current measurements into the terminal return current TRC.

Figure 6:
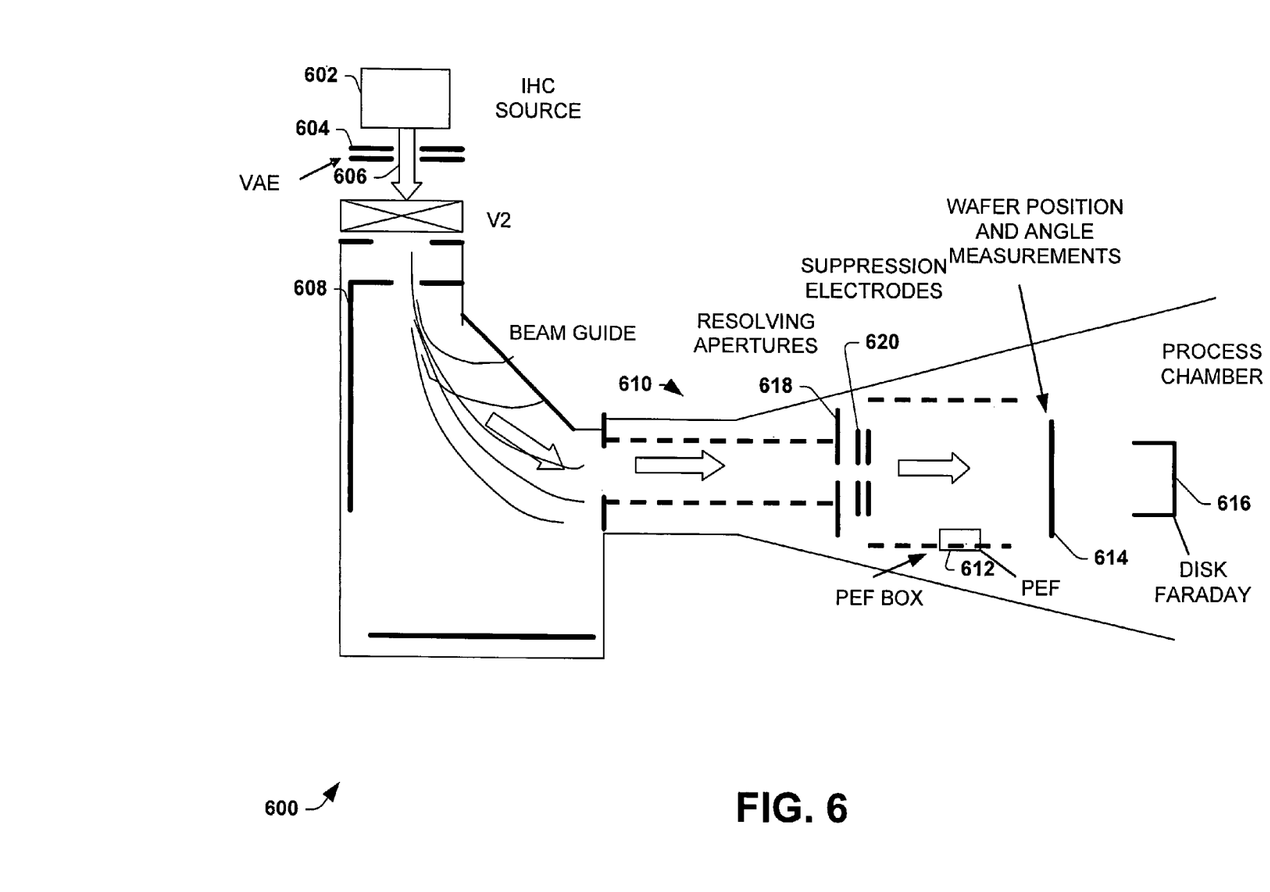
FIG. 6 is a diagram illustrating an ion implantation system in accordance with an aspect of the present invention.

FIG. 6 is a diagram illustrating an ion implantation system 600 in accordance with an aspect of the present invention. The system 600 employs resolving suppression electrodes in order to mitigate downstream secondary electrons' impact on the derived terminal return current.

The system 600 includes an ion source 602 and suppression electrodes 604 that provide an ion beam 606 with selected characteristics. A beam guide enclosure 608 comprises a beam guide portion which performs mass analysis on the ion beam 606. A beam line assembly 610 includes a variety of components including, but not limited to, resolving apertures 618, resolving suppression electrodes 620, a plasma electron flood 612, wafer position and beam angle measurement components 614, and a disk faraday 616.

The operation of the plasma electron flood 612 and/or other down stream secondary electrons can affect current measurements, for example a beam guide enclosure current measurement, employed to derive the terminal return current. As a result, the terminal return current can be inaccurate. However, the inventors of the present invention appreciate that employing resolving suppression electrodes 620, can mitigate this affect and improve terminal return current accuracy.

Figure 7:
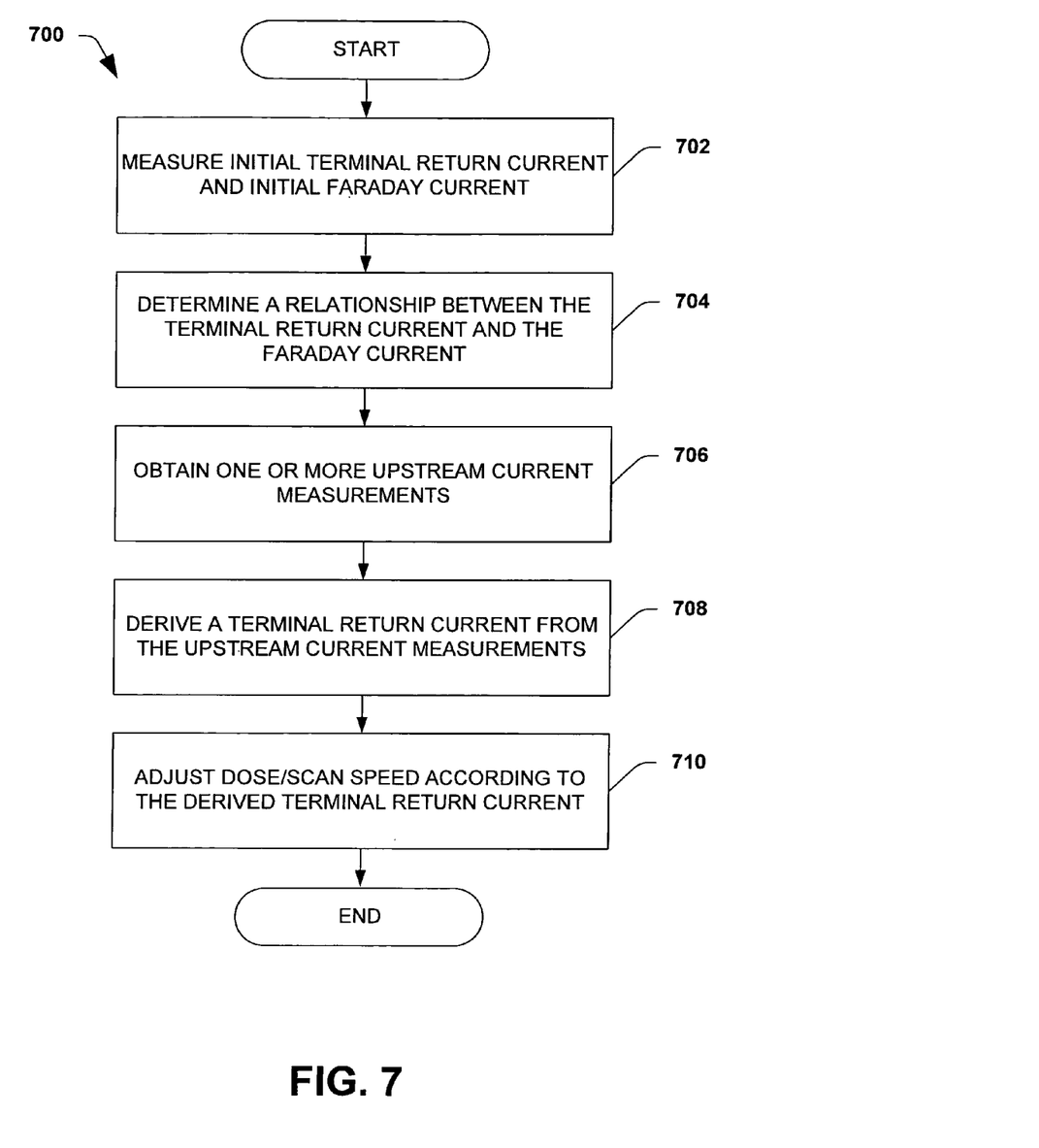
FIG. 7 is a flow diagram illustrating a method for deriving terminal return current of an ion beam and adjusting dose of the ion beam according to the terminal return current in accordance with an aspect of the present invention.

FIG. 7 is a flow diagram illustrating a method 700 for deriving terminal return current of an ion beam and adjusting dose of the ion beam according to the terminal return current in accordance with an aspect of the present invention.

The method begins at block 702, wherein an initial terminal return current and an initial faraday current is obtained/measured at a low pressure. These values can be determined at a low pressure without out-gassing such that the faraday current more nearly approximates a full current.

Continuing at block 704, a relationship between a terminal return current and a faraday current is determined at low pressure and includes obtaining initial terminal return current and faraday current values. Other characteristics can also be derived including, for example, scaling factors for current measurements, filtering aspects, addition formulas, impedance matching, and the like.

One or more upstream current/charge measurements are obtained at block 706 during ion implantation. The one or more current measurements can include beam guide enclosure current, suppression electrode currents, and the like. Additionally, the current measurements can include or consist of a single measurement from an enclosure or structure positioned downstream of a mass analyzing magnet. Resolving suppression can optionally be employed to reduce the affect of plasma electron floods and/or secondary electrons.

A terminal return current is derived from the one or more current measurements at block 708. The derivation can include scaling the current measurements, impedance matching, filtering the current measurements, and adding the current measurements, in one example. The derivation can be performed continuously, at an end of a fast scan, at various points during a fast scan, and the like. Additionally, the terminal return current can be averaged with previous terminal current values, averaged over a fast scan, and the like.

Scanning rates or speeds for slow and fast scan directions are adjusted according to the derived terminal current at block 710. In one example, a control signal for a slow scan of a scanning system is set according to an initial faraday current obtained at block 702 times a terminal return current derived at block 706 and divided by an initial terminal return current obtained at block 702. In another example, a control signal is set or adjusted according to a difference between the derived terminal return current and the initial terminal return current added to the initial faraday current. In yet another example, a control signal is set according to a pressure compensation factor, the initial terminal return current, the current derived terminal return current, and the initial faraday current. Other suitable control mechanisms are contemplated by the present invention and include adjustments to scan speed for both fast and slow scans. Additionally, it is appreciated that alternate aspects of the invention can adjust the dose of the ion beam as generated by an ion source at least partially according to the derived terminal return current. The method 700 can then continue back to block 704 for further measurements and adjustments.

It is appreciated that portions of the method 700 can be omitted and/or other additional operations performed in alternate aspects of the invention. Additionally, the order of performance can vary from how introduced.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The term "exemplary" as used herein is intended to imply an example, as opposed to best or superior. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system comprising:
an ion source that generates an ion beam along a beam path;
a mass analysis component downstream of the ion source that performs mass analysis on the ion beam;
a beamline assembly downstream of the mass analysis component;
an endstation positioned downstream of the mass analysis component that receives the ion beam;
a resolving aperture and decel located upstream of the endstation; and
a terminal return current system comprising a measuring device located upstream of the resolving aperture and decal, wherein the terminal return current system obtains a terminal return current and alters one or more parameters according to the terminal return current.

2. The system of claim 1, wherein the terminal return current system measures the terminal return current upstream of the endstation to obtain the terminal return current.

3. The system of claim 1, further comprising a terminal aperture positioned downstream of the mass analysis component and upstream of the endstation, wherein the terminal return current system obtains the terminal return current by electrically isolating source and beamline components upstream of the terminal aperture and measuring a current that maintains the source and beamline components at a selected potential or potentials.

4. The system of claim 3, wherein the terminal aperture is downstream of the mass analysis component.

5. The system of claim 1, further comprising a beamline assembly positioned along the beam path, downstream of the mass analysis component and upstream of the endstation, wherein the beamline assembly adjusts the ion beam to a selected energy.

6. The system of claim 5, wherein the beamline assembly comprises accel/decel electrodes, and the terminal return current system measures charge on the accel/decel electrodes resulting from the ion beam passing there through and the measured charge is employed to obtain the terminal return current.

7. The system of claim 1, wherein the one or more parameters include dose of the ion beam.

8. The system of claim 1, further comprising a scanning system downstream of the mass analyzer.

9. The system of claim 8, wherein the one or more parameters include scanning rates of the scanner.

10. The system of claim 1, wherein the terminal return current system comprises a scaling component that applies scaling values to one or more individual measured currents, a filtering component that filters noise from the one or more individual measured currents, an impedance matching component that compensates for impedance variations in the one or more individual measured currents, and an addition component that combines the one or more individual measured currents into the terminal return current.

11. The system of claim 1, wherein the beamline assembly comprises accel/decel electrodes located upstream of the resolving aperture, and wherein the terminal return current is obtained from measurements taken at or upstream of the accel/decel electrodes.

12. The system of claim 1, wherein the measuring device measures an induced charge on one or more integral components of the ion implantation apparatus.

13. The system of claim 1, wherein the terminal return current is measured from more than one induced currents.

14. An ion implantation system comprising:
an ion source that generates an ion beam along a beam path;
a mass analysis component downstream of the ion source that performs mass analysis on the ion beam;
a beamline assembly downstream of the mass analysis component;
an endstation positioned downstream of the mass analysis component that receives the ion beam;
a terminal return current system that obtains a terminal return current and alters one or more parameters according to the terminal return current; and
a beamline assembly positioned along the beam path, downstream of the mass analysis component and upstream of the endstation, wherein the beamline assembly adjusts the ion beam to a selected energy;
wherein the terminal return current system measures one or more individual currents from housings within the mass analysis component and the beamline assembly to obtain the terminal return current.

15. The system of claim 14, wherein the terminal return current system assigns weights to the one or more individual currents.

16. A terminal return current system comprising:
an ion source that generates an ion beam that travels along a beam path;
a mass analyzer downstream of the ion source that performs mass analysis on the ion beam;
an end station downstream of the mass analyzer that receives the ion beam;
a faraday cup proximate to the end station that measures beam current of the ion beam;
a resolving aperture and decel located upstream of the endstation; and
a measuring device located upstream of the resolving aperture and decel and configured to measure beam induced charge from one or more elements positioned along the beam path upstream of the end station, wherein the measured beam induced charge is a function of beam current of the ion beam.

17. The system of claim 16, wherein the one or more elements include extraction electrodes of the ion source.

18. The system of claim 16, wherein the one or more elements include an aperture of the ion source.

19. The system of claim 16, wherein the one or more elements include a terminal housing containing the ion source.

20. The system of claim 16, wherein the one or more elements include a beamline housing containing the mass analyzer.

21. The system of claim 16, wherein the measured beam induced charge is weighted according to a calibration measurement of the faraday cup.

22. A method of adjusting operation of an ion implantation system, the method comprising:
providing an ion beam along a beam path;
obtaining one or more induced current measurements on elements along the beam path;
scaling the one or more induced current measurements by scaling factors;
filtering the one or more induced current measurements;
adding the one or more induced current measurements to obtain a terminal return current; and
adjusting dose of the ion beam according to the terminal return current.

23. The method of claim 22, wherein adjusting the dose comprises adjusting a slow scan speed.

24. The method of claim 22, wherein adjusting the dose comprises adjusting a fast scan speed.

25. The method of claim 22, wherein adjusting the dose comprises altering an ion source.

26. The method of claim 22, wherein obtaining the one or more induced current measurements comprises measuring induced charge on a terminal housing.

27. The method of claim 22, further comprising determining the scaling factors according to a measured calibration value.

* * * * *

UNITED STATES PATENT AND TRADEMARK OFFICE
CERTIFICATE OF CORRECTION

PATENT NO. : 7,557,363 B2  Page 1 of 1
APPLICATION NO. : 11/543346
DATED : July 7, 2009
INVENTOR(S) : Yongzhang Huang et al.

It is certified that error appears in the above-identified patent and that said Letters Patent is hereby corrected as shown below:

Column 10, Claim 1, line 60; please replace "decal" with --decel--

Signed and Sealed this

Eleventh Day of August, 2009

David J. Kappos
*Director of the United States Patent and Trademark Office*